(12) United States Patent
Hsu et al.

(10) Patent No.: US 11,829,561 B2
(45) Date of Patent: Nov. 28, 2023

(54) FLOATING IMAGE GENERATION DEVICE AND FLOATING IMAGE TOUCH-CONTROL DEVICE

(71) Applicant: Darwin Precisions Corporation, Hsinchu County (TW)

(72) Inventors: Chih-Ping Hsu, Hsinchu County (TW); Ran-Shiou You, Hsinchu County (TW); Yu Jen Lai, Hsinchu County (TW); Ya Han Ko, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/957,215

(22) Filed: Sep. 30, 2022

(65) Prior Publication Data
US 2023/0115995 A1   Apr. 13, 2023

(30) Foreign Application Priority Data
Oct. 7, 2021  (TW) ................. 110137386

(51) Int. Cl.
*G06F 3/042*  (2006.01)
*G03H 1/00*  (2006.01)
(Continued)

(52) U.S. Cl.
CPC ......... *G06F 3/0428* (2013.01); *G03H 1/0005* (2013.01); *G06F 3/0416* (2013.01);
(Continued)

(58) Field of Classification Search
CPC ...... G06F 3/0428; G06F 3/0416; G03H 1/005
(Continued)

(56) References Cited

U.S. PATENT DOCUMENTS

| 2017/0090198 A1* | 3/2017 | Takagi | G02B 27/0172 |
| 2019/0155033 A1* | 5/2019 | Gelman | G02B 27/0093 |
| 2022/0299937 A1* | 9/2022 | Kim | G03H 1/2205 |

FOREIGN PATENT DOCUMENTS

CN      112265878 A      1/2021

OTHER PUBLICATIONS

Lee, "Unspeakable Secrets—Scanimation Production", Mar. 13, 2017, https://jibaoviewer.com/project/58c62095027f275411b90356.

* cited by examiner

*Primary Examiner* — Calvin C Ma
(74) *Attorney, Agent, or Firm* — WPAT, P.C.

(57) ABSTRACT

A floating image generation device is disclosed, which includes a light source, an image generation module, and a floating image generation unit. The image generation module is disposed above the light source and includes a shading unit and an image generation unit. The shading unit is capable of changing light transmissivity state. The image generation unit is disposed above the shading unit. The floating image generation unit is disposed above the image generation unit. The light source emits a light passing through the shading unit, the image generation unit, and the floating image generation unit to generate a first floating image when the shading unit is in a first light transmissivity state. The light source emits a light passing through the shading unit, the image generation unit, and the floating image generation unit to generate a second floating image when the shading unit is in a second light transmissivity state.

4 Claims, 8 Drawing Sheets

(51) Int. Cl.
*G06F 3/041* (2006.01)
*G02F 1/1333* (2006.01)

(52) U.S. Cl.
CPC . *G02F 1/13338* (2013.01); *G03H 2001/0088* (2013.01); *G06F 2203/04108* (2013.01)

(58) Field of Classification Search
USPC ......................................................... 345/156
See application file for complete search history.

221 222 223

| A | B | C | A | B |
|---|---|---|---|---|
| C | A | B | C | A |
| B | C | A | B | C |
| A | B | C | A | B |
| C | A | B | C | A |

FLOATING IMAGE GENERATION DEVICE AND FLOATING IMAGE TOUCH-CONTROL DEVICE

CROSS-REFERENCE TO RELATED APPLICATION

This application claims the priority benefit of Taiwan application serial no. 110137386 filed on Oct. 7, 2021. The entirety of the above-mentioned patent applications is hereby incorporated by reference herein and made a part of this specification.

BACKGROUND

Technical Field

The present invention relates to a floating image generation device and a floating image touch-control device.

Related Art

Conventional control buttons are mostly mechanical or sensing buttons triggered by physical touch. In other words, users have to touch buttons or panels during operation. To avoid the spread of bacteria or virus this way, touch-control panels having floating image touch-control functions are used. However, user experience of current touch-control panels is still improvable since it is hard to tell if a touch-control panel having floating-image touch-control functions is triggered.

SUMMARY

One of objectives of the present invention is to provide a floating image generation device, capable of making the images changeable.

One of objectives of the present invention is to provide a floating image touch-control device, capable of providing better user's experience.

The floating image generation device of the present invention includes a light source, an image generation module, and a floating image generation unit. The image generation module is disposed above the light source and includes a shading unit and an image generation unit. The shading unit is capable of changing light transmissivity state. The image generation unit is disposed above the shading unit. The floating image generation unit is disposed above the image generation unit. When the shading unit is in a first light transmissivity state, the light source emits a light passing through the shading unit, the image generation unit, and the floating image generation unit to generate a first floating image. When the shading unit is in a second light transmissivity state, the light source emits a light passing through the shading unit, the image generation unit, and the floating image generation unit to generate a second floating image.

In one embodiment, the floating image generation device includes a light source, an image generation module, and a floating image generation unit. The image generation module is disposed above the light source and includes a shading unit and an image generation unit. The image generation unit includes a first translucent unit and a second translucent unit disposed in the shading unit. The floating image generation unit is disposed above the image generation unit. The light source emits a first light passing through the first translucent unit and the floating image generation unit to generate a third floating image. The light source emits a second light passing through the second translucent unit and the floating image generation unit to generate a fourth floating image.

The floating image touch-control device of the present invention includes the floating image generation device and a sensing module disposed on the floating image generation device. The image generated by the floating image generation device changes when the sensing module senses a touch-control motion.

BRIEF DESCRIPTION OF THE DRAWINGS

FIG. 4A is a schematic diagram of different embodiment of an image generation unit in a floating image generation device according to the present invention.

FIG. 4B is a schematic diagram of different embodiment of a shading unit in a floating image generation device according to the present invention.

DETAILED DESCRIPTION

Figure 1:
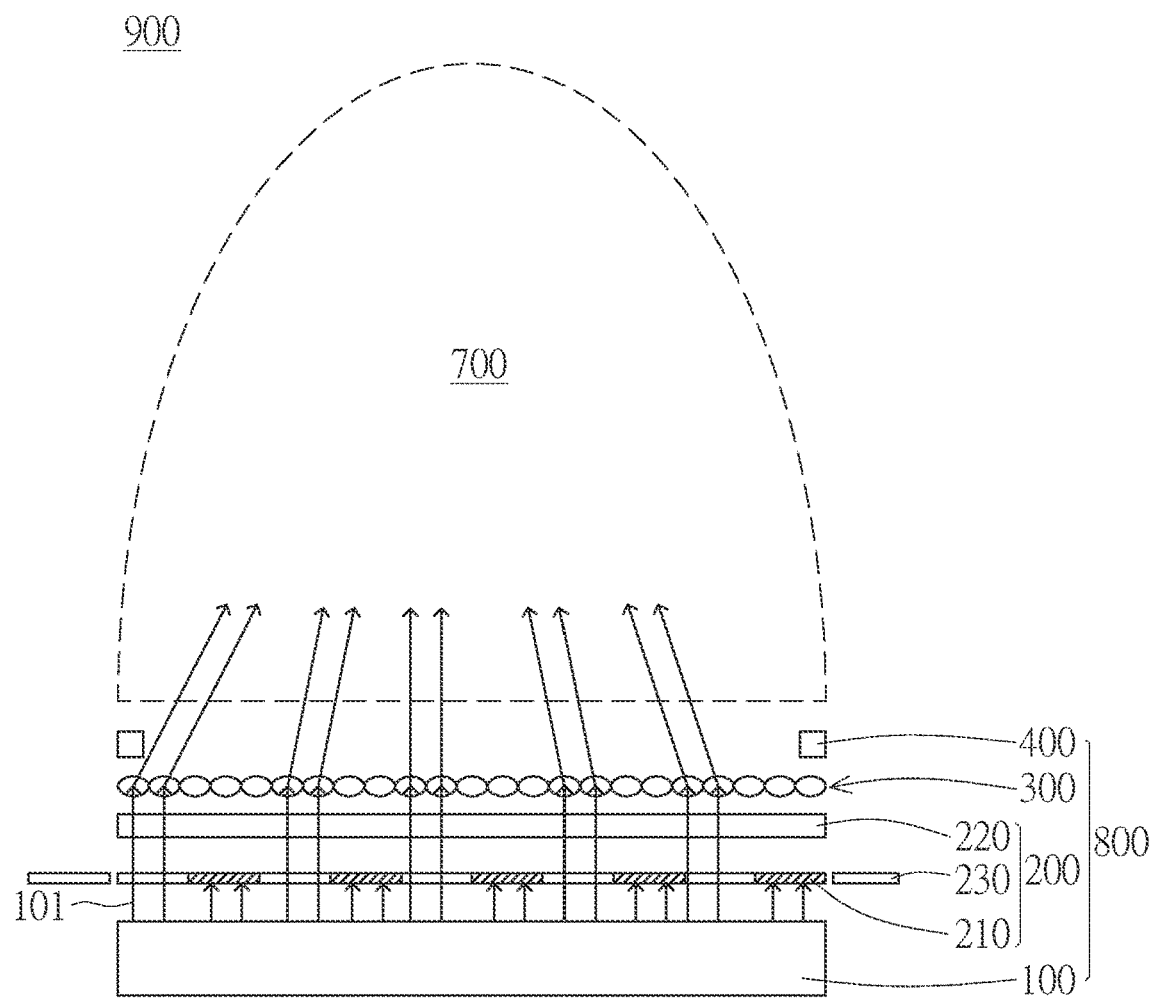
FIG. 1 is a schematic diagram of an embodiment of a floating image touch-control device according to the present invention.

Implementations of a connection assembly disclosed by the present invention are described below by using particular and specific embodiments with reference to the drawings, and a person skilled in the art may learn of advantages and effects of the present invention from the disclosure of this specification. However, the following disclosure is not intended to limit the protection scope of the present invention, and a person skilled in the art may carry out the present invention by using other different embodiments based on different viewpoints without departing from the concept and spirit of the present invention. In the accompanying drawings, plate thicknesses of layers, films, panels, regions, and the like are enlarged for clarity. Throughout the specification, same reference numerals indicate same elements. It should be understood that when an element such as a layer, film, region or substrate is referred to as being "on" or "connected" to another element, it may be directly on or connected to the another element, or intervening elements may also be present. In contrast, when an element is referred to as being "directly on" or "directly connected to" another element, there is no intervening element present. As used herein, "connection" may refer to a physical and/or electrical connection. Further, "electrical connecting" or "coupling" may indicate that another element exists between two elements.

It should be noted that the terms "first", "second", "third", and the like that are used in the present disclosure can be used for describing various elements, components, regions, layers and/or portions, but the elements, components, regions, layers and/or portions are not limited by the terms. The terms are merely used to distinguish one element, component, region, layer, or portion from another element, component, region, layer, or portion. Therefore, the "first element", "component", "region", "layer", or "portion" discussed below may be referred to as a second element, component, region, layer, or portion without departing from the teaching of this disclosure.

In addition, relative terms, such as "down" or "bottom" and "up" or "top", are used to describe a relationship between an element and another element, as shown in the figures. It should be understood that the relative terms are intended to include different orientations of a device in addition to orientations shown in the figures. For example, if a device in a figure is turned over, an element that is described to be on a "lower" side of another element is directed to be on an "upper" side another element. Therefore, the exemplary terms "down" may include orientations of "down" and "up" and depends on a particular orientation of an accompanying drawing. Similarly, if a device in a figure is turned over, an element that is described as an element "below" another element or an element "below" is directed to be "above" another element. Therefore, the exemplary terms "below" or "below" may include orientations of up and down.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

As shown in the embodiment in FIG. 1, the floating image generation device 800 of the present invention includes a light source 100, an image generation module 200, and a floating image generation unit 300. More particularly, the floating image generation device 800 is capable of generating changeable floating images on the side of the floating image generation unit 300 that is opposite to the light source 100. Moreover, the floating image generation device 800 can be used in conjunction with a sensing module 400 to form a floating image touch-control device 900 of the present invention. The image generated by the floating image generation device 800 changes when the sensing module 400 senses a touch-control motion in a sensing area 700.

Figure 2:
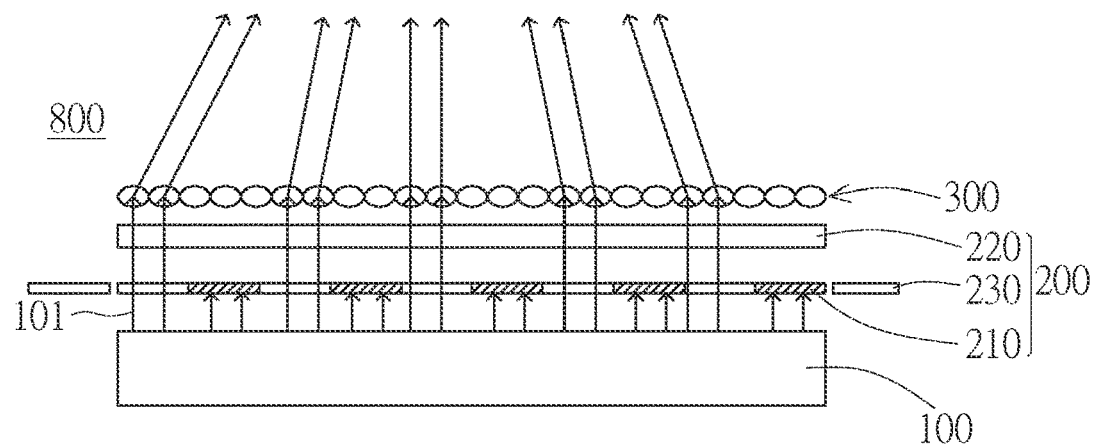
FIG. 2 is a schematic diagram of an embodiment of a floating image generation device according to the present invention.

As shown in the embodiment in FIG. 2, the image generation module 200 is disposed above the light source 100 and includes a shading unit 210 and an image generation unit 220. The shading unit 210 is capable of changing light transmissivity state by restricting the route of a light 101 emitted by the light source 100 passing through the shading unit 210, i.e., by controlling the portion of the shading unit 210 through which the light 101 emitted by the light source 100 can pass. The image generation unit 220 is disposed above the shading unit 210, wherein the pattern to be generated as the floating image is disposed on the image generation unit 220. In different embodiments, the image generation unit 220 can be photographic films, masks, OLED, etc. The floating image generation unit 300 is disposed above the image generation unit 220. In an embodiment, the floating image generation unit 300 is a micro-lens array, which can include single-side or dual-side converging lens structures and can be formed by processes such as UV-imprinting, injection, heat-pressing, etc. After passing through the shading unit 210 and the image generation unit 220, the light emitted by the light source 100 can generate a floating image on the side of the floating image generation unit 300 that is opposite to the light source 100 via the refraction of the floating image generation unit 300. When the shading unit 210 is in a first light transmissivity state, the light source 100 emits a light 101 passing through the shading unit 210, the image generation unit 220, and the floating image generation unit 300 to generate a first floating image. When the shading unit 210 is in a second light transmissivity state, the light source 100 emits a light 101 passing through the shading unit 210, the image generation unit 220, and the floating image generation unit 300 to generate a second floating image.

Figure 3A:
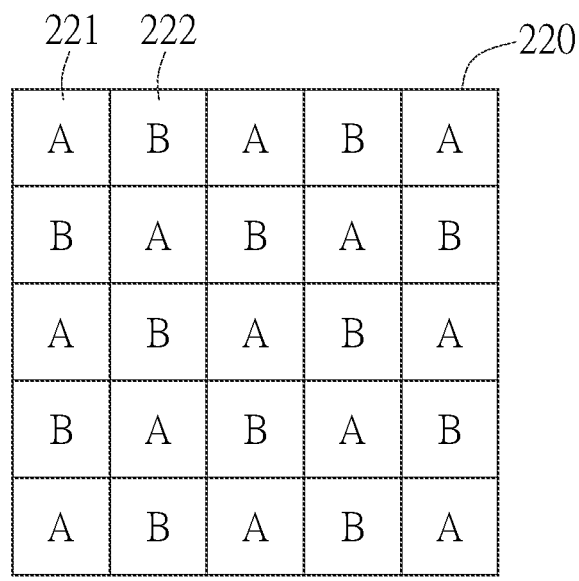
FIG. 3A is a schematic diagram of an embodiment of an image generation unit in a floating image generation device according to the present invention.
Figure 3B:
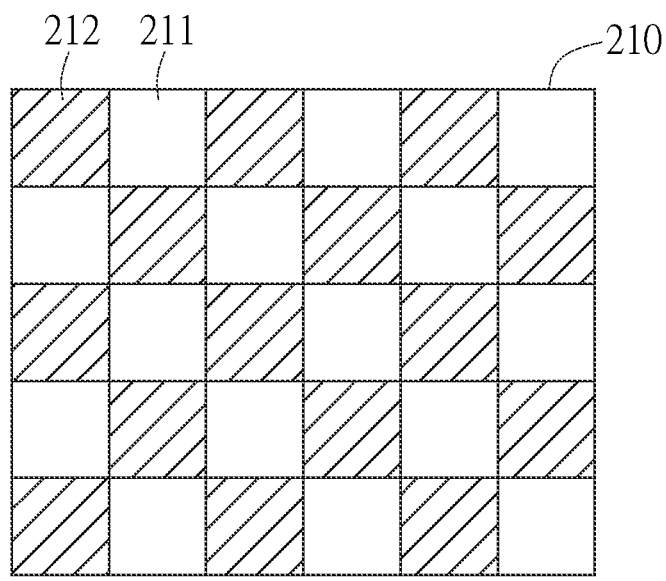
FIG. 3B is a schematic diagram of an embodiment of a shading unit in a floating image generation device according to the present invention.

More particularly, as shown in the embodiment in FIG. 3A, the image generation unit 220 includes a plurality of first image generation areas 221 and a plurality of second image generation areas 222 which are adjacent to each other and are distributed in a chessboard pattern. In other words, in an embodiment, two first image generation areas 221 and two second image generation areas 222 form a 2*2 chessboard pattern unit, wherein in the 2*2 chessboard pattern unit, two first image generation areas 221 are distributed in opposite corners and two second image generation areas 222 are distributed in opposite corners. Correspondingly, as shown in the embodiment in FIG. 3B, the shading unit 210 includes a plurality of shading areas 212 and a plurality of translucent areas 211 which are adjacent to each other and are distributed in a chessboard pattern.

Figure 3C:
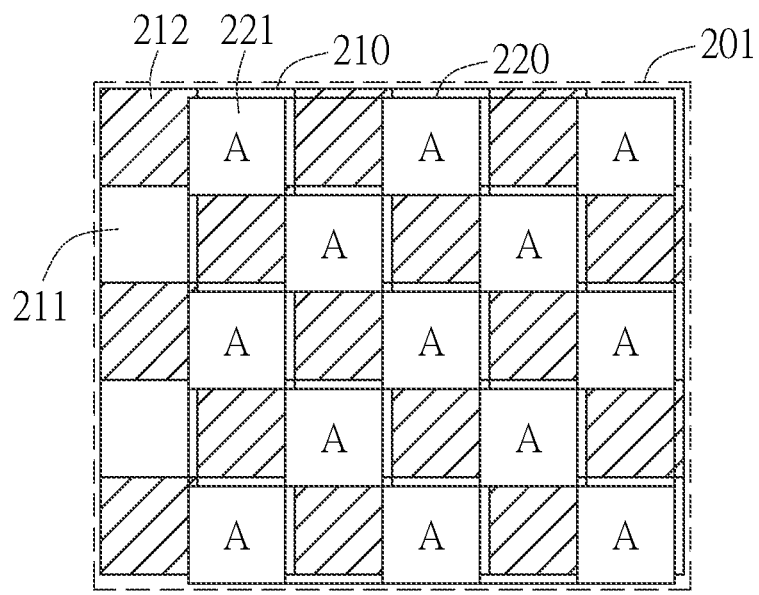
FIG. 3C is a schematic diagram of an embodiment of a shading unit in a floating image generation device in a first light transmissivity state according to the present invention.
Figure 3D:
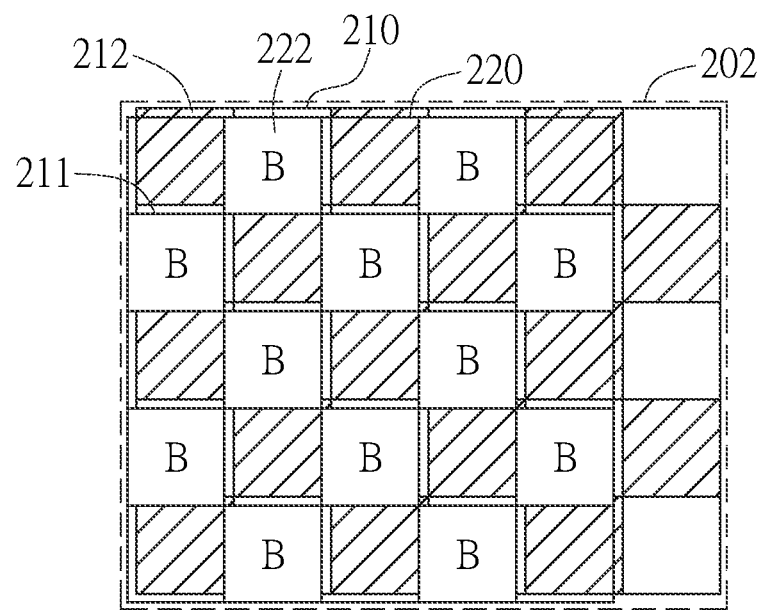
FIG. 3D is a schematic diagram of an embodiment of a shading unit in a floating image generation device in a second light transmissivity state according to the present invention.

As shown in the embodiments in FIGS. 3C and 3D, since the shading unit 210 is disposed on the light source 100 (as shown in FIG. 2), the light emitted by the light source 100 can only pass through the translucent areas 211 of the shading unit 210 to arrive at the image generation unit 220 disposed above the shading unit 210. Accordingly, the shading unit 210 can change the location of the translucent areas 211 with respect to the light source 100 by level shifting and restrict the route of a light 101 emitted by the light source 100 passing through the shading unit 210, i.e., control the portion of the shading unit 210 through which a light 101 emitted by the light source 100 can pass, to achieve the effect of changing the light transmissivity states. In the embodiment, the shading unit 210 changes between the first light transmissivity state as shown in FIG. 3C and the second light transmissivity state as shown in FIG. 3D by level shifting.

More particularly, as shown in the embodiment in FIG. 3C, when the shading unit 210 moves to the first position 201, it is in the first light transmissivity state, wherein the vertical projection of a plurality of translucent areas 211 on the projection plane parallel to the light source 100 (as shown in FIG. 2) overlaps the vertical projection of the first image generation areas 221 on the projection plane. The light 101 emitted by the light source 100 can pass through the translucent areas 211 to arrive at the first image generation areas 221 having patterns such as symbol "A" and then pass through the first image generation areas 221 and the floating image generation unit 300 (as shown in FIG. 2) to generate a first floating image such as symbol "A". As shown in the embodiment in FIG. 3D, when the shading unit 210 moves to the second position 202, it is in the second light transmissivity state, wherein the vertical projection of a plurality of translucent areas 211 on the projection plane parallel to the light source 100 overlaps the vertical projection of the second image generation areas 222 on the projection plane. The light 101 emitted by the light source 100 can pass through the translucent areas 211 to arrive at the second image generation areas 222 having patterns such as symbol "B" and then pass through the second image generation areas 222 and the floating image generation unit 300 to generate a second floating image such as symbol "B". In an embodiment, the size of each of the shading areas is 0 to 30% larger than the size of each of the translucent areas to ensure sufficient light shading of the shading areas and improve the quality of the floating image.

Figure 5A:
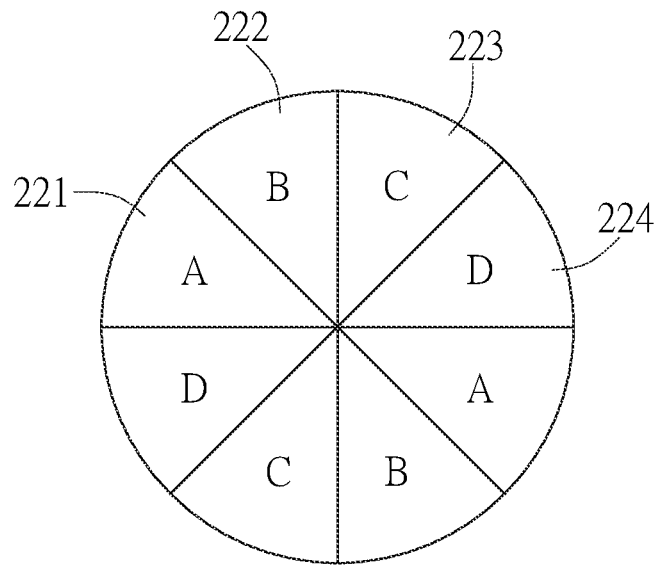
FIG. 5A is a schematic diagram of different embodiment of an image generation unit in a floating image generation device according to the present invention.
Figure 5B:
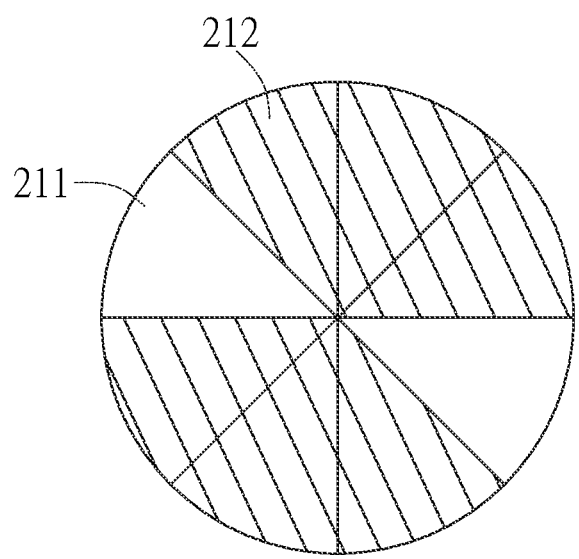
FIG. 5B is a schematic diagram of different embodiment of a shading unit in a floating image generation device according to the present invention.

In different embodiments, a plurality of first image generation areas 221 and a plurality of second image generation areas 222 of the image generation unit 220 are not limited to being adjacent to each other and distributed in a 2*2 chessboard pattern, and a plurality of shading areas 212 and a plurality of translucent areas 211 of the shading unit 210 are not limited to being adjacent to each other and distributed in a 2*2 chessboard pattern. As shown in the embodiments in FIGS. 4A and 4B, for example, a plurality of first image generation areas 221, a plurality of second image generation areas 222, and a plurality of third image generation areas 223 of the image generation unit 220 are adjacent to each other and distributed in a 3*3 chessboard pattern. Correspondingly, a plurality of shading areas 212 and a plurality of translucent areas 211 of the shading unit 210 are not limited to being adjacent to each other and distributed in a 3*3 chessboard pattern. As shown in the embodiments in FIGS. 5A and 5B, the image generation unit 220 is a circular disc, wherein the first image generation area 221, the second image generation area 222, the third image generation area 223, and the fourth image generation area 224 are disposed in sequence and in a circular sector distribution. Correspondingly, the shading unit 210 is also a circular disc, wherein the translucent areas 211 are disposed in a circular sector distribution between the remaining shading areas. In this embodiment, the shading unit 210 changes between different light transmissivity states by rotating.

Figure 6A:
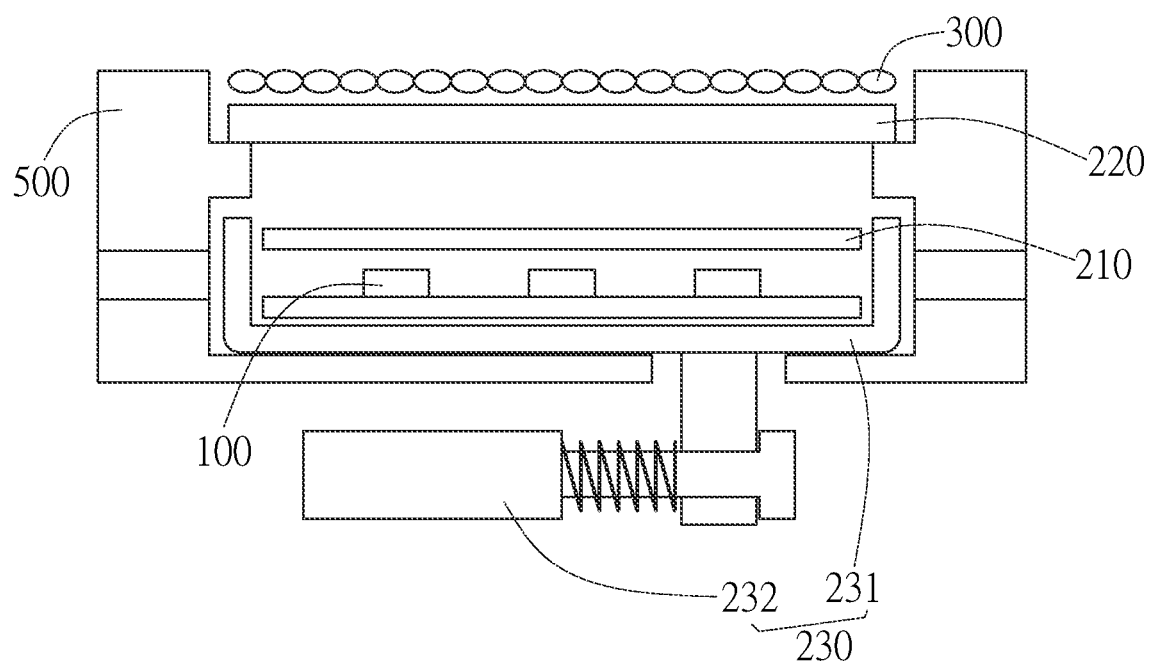
FIGS. 6A to 6C are schematic diagrams of an embodiment of a moving device in a floating image generation device according to the present invention.
Figure 6B:
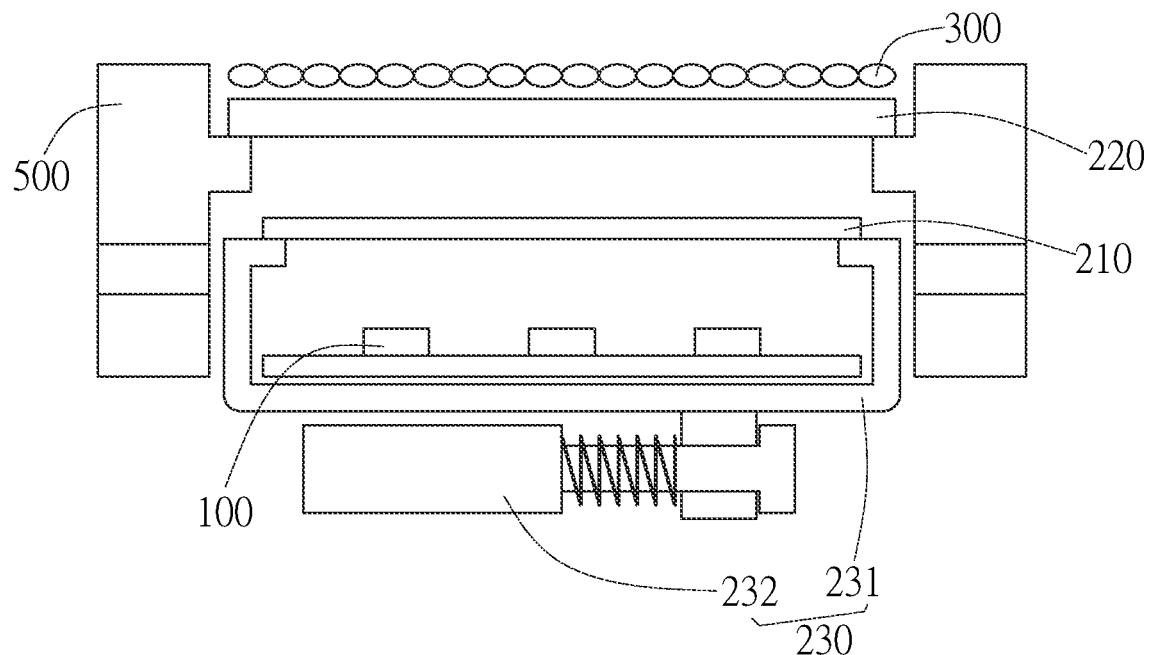
Figure 6C:
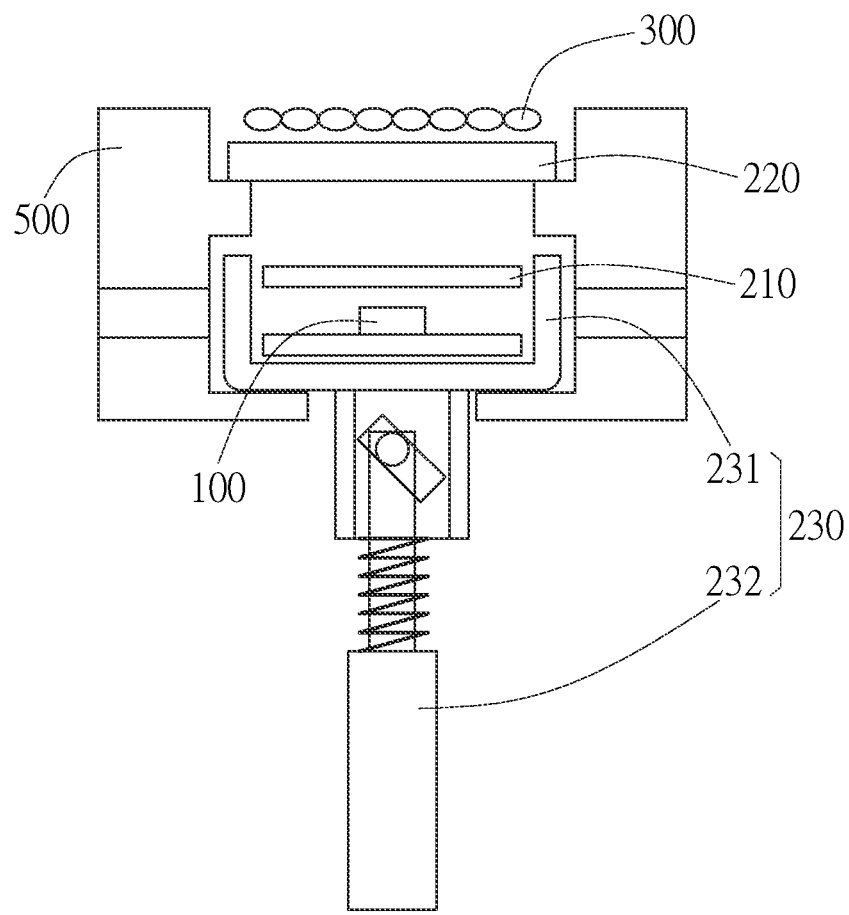

As shown in the embodiments in FIGS. 6A to 6C, the shading unit 210 can achieve the effect of moving by way of a moving device 230. More particularly, the moving device 230 includes a support 231 and a driving device 232 such as an electromagnetic fine motion device. The shading unit 210 and the light source 100 are disposed on the support 231, wherein the floating image generation unit 300 and the image generation unit 220 are disposed on a frame 500. The driving device 232 can drive the support 231 to move and hence makes the shading unit 210 move. In other words, in this embodiment, the shading unit 210 and the light source 100 can move together with the support 231 with respect to the frame 500. As shown in a different embodiment in FIG. 6B, only the shading unit 210 is disposed on the support 231, wherein the light source 100 is fixed on the frame 500. In other words, in this embodiment, only the shading unit 210 and the support 231 move with respect to the frame 500. As shown in a different embodiment in FIG. 6C, for an environment having a smaller light emitting range (such as a single sensing button), the light source 100 can be a point light source, wherein the structures and directions of the components such as the support 231 and the driving device 232 can be modified.

Figure 7:
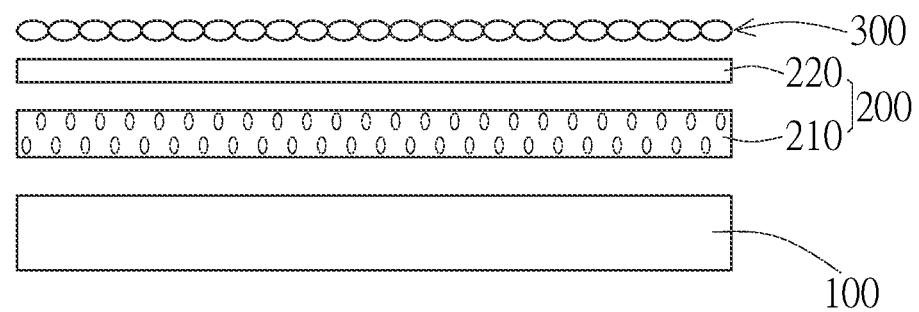
FIG. 7 is a schematic diagram of different embodiment of a floating image generation device according to the present invention.

In the foregoing embodiments, the shading unit 210 changes the location of the translucent areas 211 with respect to the light source 100 by level shifting, hence achieving the effect of changing the light transmissivity state. In different embodiments, however, the corresponding position of the shading unit 210 can be fixed, and the light transmissivity state can be changed by changing the form of the shading unit 210. As shown in the embodiment in FIG. 7, the shading unit 210 includes a liquid crystal module, wherein the shading unit 210 restricts the route of a light 101 emitted by the light source 100 passing through the shading unit 210, i.e., the shading unit 210 controls the portion of the shading unit 210 through which the light 101 emitted by the light source 100 can pass by changing the shading area and the translucent area generated by the liquid crystal module, to achieve the effect of changing the light transmissivity states.

Figure 8A:
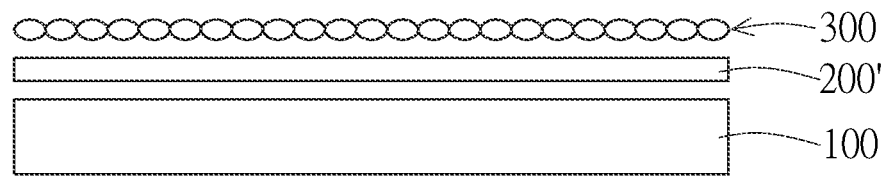
FIG. 8A is a schematic diagram of different embodiment of a floating image generation device according to the present invention.
Figure 8B:
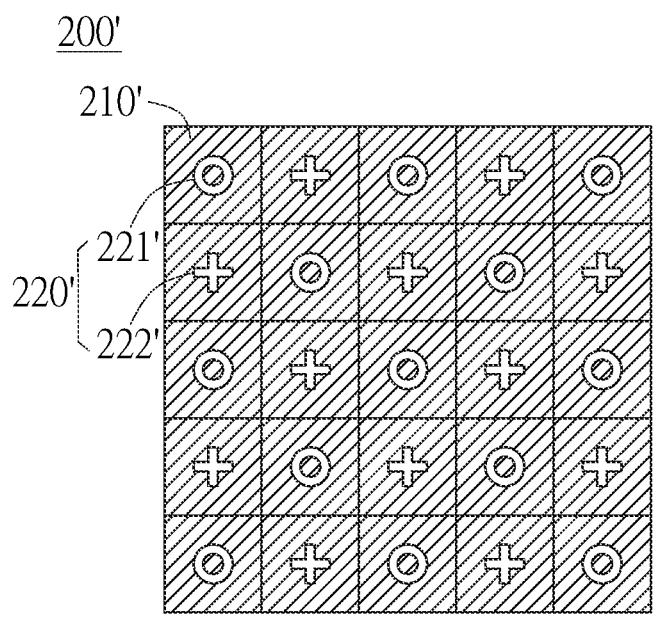
FIG. 8B is a schematic diagram of different embodiment of an image generation module in a floating image generation device according to the present invention.

In different embodiments, the shading unit and the image generation unit can be incorporated into one component, i.e., making one component having both the shading unit and the image generation unit and controlling the color of the light emitted by the light source to achieve the aforementioned effect of changing the generated floating image. More particularly, as shown in the embodiments in FIGS. 8A and 8B, the floating image generation device 800 includes a light source 100, an image generation module 200', and a floating image generation unit 300. The image generation module 200' is disposed above the light source 100. The floating image generation unit 300 is disposed above the image generation unit 220'. The image generation module 200' includes a shading unit 210' and an image generation unit 220'. The image generation unit 220 includes a first translucent unit 221' and a second translucent unit 222' in the shading unit 210'. From a different point of view, the shading unit 210' in this embodiment shades the light entirely, wherein the first translucent unit 221' and the second translucent unit 222' embedded in the shading unit 210' allow particular light to pass through. For example, the first translucent unit 221' allows a first light to pass through, wherein the second translucent unit 222' allows a second light to pass through. The color of the first light and the color of the second light are preferably complementary colors. For example, the color of the first light and the color of the second light are respectively red and cyan. As such, when the light source 100 emits the first light, the first light can pass through the first translucent unit 221' and the floating image generation unit 300 to generate a third floating image such as rings. When the light source 100 emits the second light, the second light can pass through the second translucent unit 222' and the floating image generation unit 300 to generate a fourth floating image such as crosses.

Accordingly, the floating image generation device 800 of the present invention is capable of making the generated floating images changeable. More particularly, in the floating image touch-control device 900 of the present invention, when the sensing module 400 senses a touch-control motion in a sensing area 700, the sensing module 400 generates a signal to drive the shading unit 210 to change the light transmissivity state, hence making the image generated by the floating image generation device 800 change. Therefore, a user can visually confirm whether he successfully touch-controls the floating image touch-control device 900 when he operates the same, hence having a better user experience.

The present invention is described by means of the above-described relevant embodiments. However, the above-described embodiments are only examples for implementing the present invention. It should be pointed out that the disclosed embodiments do not limit the scope of the present invention. In contrast, the spirit included in the scope of the patent application and modifications and equivalent settings made within the scope are all included in the scope of the present invention.

What is claimed is:

1. A floating image generation device, comprising:
   a light source;
   an image generation module disposed above the light source, including:
      a shading unit capable of changing light transmissivity state; and
      an image generation unit disposed above the shading unit; and
   a floating image generation unit disposed above the image generation unit;
   wherein when the shading unit is in a first light transmissivity state, the light source emits a light passing through the shading unit, the image generation unit, and the floating image generation unit to generate a first floating image;
   wherein when the shading unit is in a second light transmissivity state, the light source emits a light passing through the shading unit, the image generation unit, and the floating image generation unit to generate a second floating image;
   wherein the shading unit is a circular disc including a plurality of shading areas and a plurality of translucent areas in circular sector distribution;
   wherein the shading unit changes between the first light transmissivity state and the second light transmissivity state by rotating between a first location and a second location.

2. A floating image touch-control device, comprising:
   the floating image generation device according to claim 1;
   a sensing module disposed on the floating image generation device, wherein the image generated by the floating image generation device changes when the sensing module senses a touch-control motion.

3. A floating image generation device, comprising:
   a light source;
   an image generation module disposed above the light source, including:
      a shading unit capable of changing light transmissivity state; and
      an image generation unit disposed above the shading unit; and
   a floating image generation unit disposed above the image generation unit;
   wherein when the shading unit is in a first light transmissivity state, the light source emits a light passing through the shading unit, the image generation unit, and the floating image generation unit to generate a first floating image;
   wherein when the shading unit is in a second light transmissivity state, the light source emits a light passing through the shading unit, the image generation unit, and the floating image generation unit to generate a second floating image;
   wherein the shading unit includes a plurality of shading areas and a plurality of translucent areas which are adjacent to each other and are distributed in a chessboard pattern;
   wherein the image generation unit includes a plurality of first image generation areas and a plurality of second image generation areas which are adjacent to each other and are distributed in a chessboard pattern, wherein when the shading unit is in a first light transmissivity state, the vertical projection of a plurality of translucent areas on a projection plane parallel to the light source overlaps the vertical projection of the first image generation areas on the projection plane, wherein when the shading unit is in a second light transmissivity state, the vertical projection of a plurality of translucent areas on the projection plane overlaps the vertical projection of the second image generation areas on the projection plane.

4. A floating image touch-control device, comprising:
   the floating image generation device according to claim 3;
   a sensing module disposed on the floating image generation device, wherein the image generated by the floating image generation device changes when the sensing module senses a touch-control motion.

\* \* \* \* \*